United States Patent [19]

Haseke

[11] 4,368,821

[45] Jan. 18, 1983

[54] ARRANGEMENT FOR MOUNTING PRINTED CIRCUIT BOARDS, PARTITIONS AND THE LIKE IN A HOUSING

[75] Inventor: Horst Haseke, Minden, Fed. Rep. of Germany

[73] Assignee: Rose Elektrotechnik GmbH & Co. KG, Porta Westfalica, Fed. Rep. of Germany

[21] Appl. No.: 196,142

[22] Filed: Oct. 10, 1980

[30] Foreign Application Priority Data

Jun. 10, 1980 [DE] Fed. Rep. of Germany ....... 3021655

[51] Int. Cl.³ ............................................. H05K 7/12
[52] U.S. Cl. .................................... 211/41; 361/413; 361/415
[58] Field of Search .................. 361/415, 413; 211/41; 339/75 MP, 17 L, 17 LM

[56] References Cited

U.S. PATENT DOCUMENTS

| | | | |
|---|---|---|---|
| 3,202,955 | 8/1965 | McKee | 361/415 X |
| 3,845,359 | 10/1974 | Fedele | 361/415 X |
| 3,950,057 | 4/1976 | Calabro | 361/415 X |

*Primary Examiner*—R. R. Kucia
*Attorney, Agent, or Firm*—Michael J. Striker

[57] ABSTRACT

An arrangement for mounting printed circuit boards, mounting partitions and the like in a housing, has a supporting member arranged to support a printed circuit board, mounting partition and the like, and a spring member provided on the supporting member and arranged to be relaxed so that it has a length corresponding to the length of the supporting member, and to be tensioned so that it assumes a length exceeding the length of the supporting member, whereby the spring member engages the housing and arrests the supporting member.

12 Claims, 7 Drawing Figures

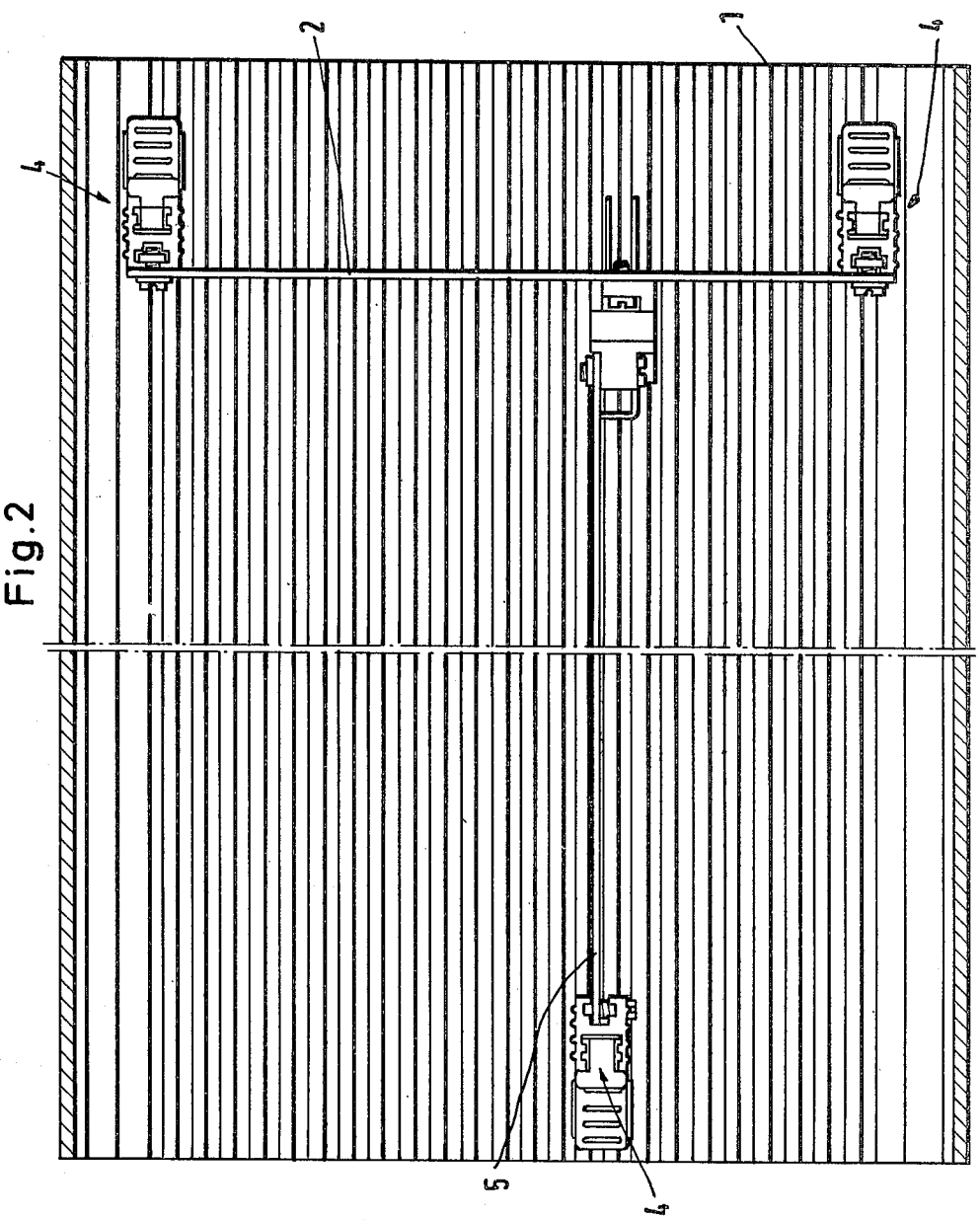

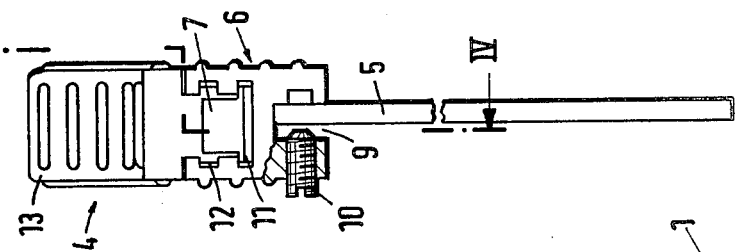
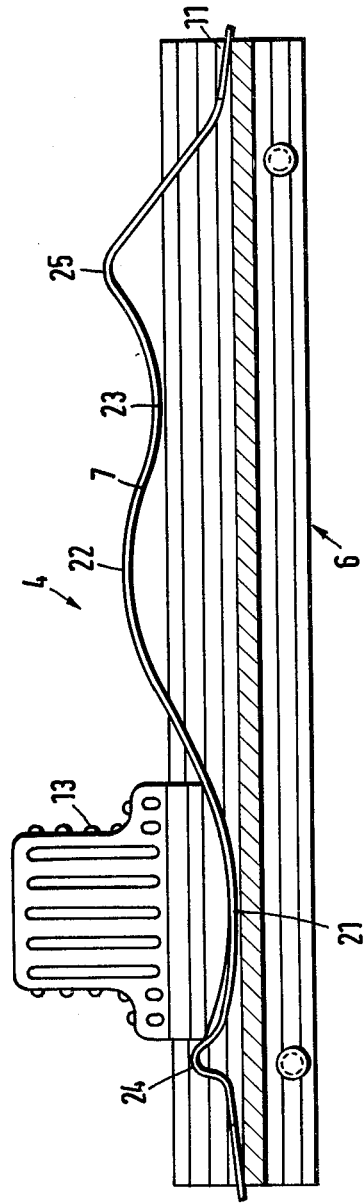
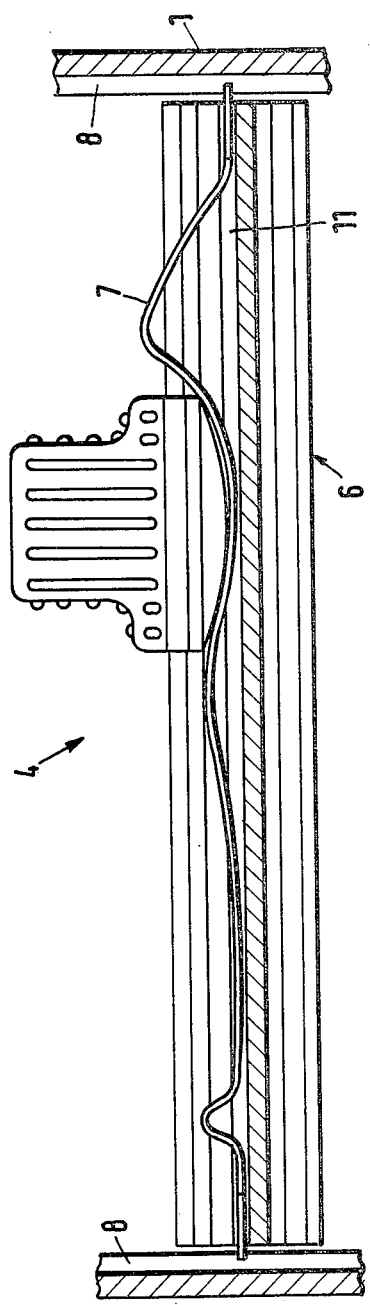

ARRANGEMENT FOR MOUNTING PRINTED CIRCUIT BOARDS, PARTITIONS AND THE LIKE IN A HOUSING

BACKGROUND OF THE INVENTION

The present invention relates to an arrangement for mounting printed circuit boards, partitions or the like in a housing.

Arrangements for mounting printed circuit boards, partitions and the like in housings, particularly in electronic switch housings, are known in the art. The known arrangements of the above-mentioned general type possess some disadvantages in the sense of their capability of fast and reliable fixation of printed circuit boards, partitions and the like in the housings.

SUMMARY OF THE INVENTION

Accordingly, it is an object of the present invention to provide an arrangement for mounting printed circuit boards, partitions and the like, which avoid the disadvantages of the prior art.

More particularly, it is an object of the present invention to provide an arrangement which allows fast and reliable mounting of printed circuit boards, partitions and the like in an electronic switch housing.

In keeping with these objects, and with others which will become apparent hereinafter, one feature of the present invention resides, briefly stated, in an arrangement which has an elongated supporting member to be inserted into and withdrawn out of the housing, holding means on one of the edges of the supporting member for holding a printed circuit board, partition and the like, arresting means on the other of the edges of the supporting member and including a spring member expansible in its direction of elongation so as to engage the housing and contractable in this direction so as to disengage from the housing, whereby the supporting member can be retained in or withdrawn from the housing. More particularly, the spring member has in the first position a length corresponding to the length of the supporting member, and in the second position a length exceeding the length of the supporting member. More particularly, the spring member may be formed as a spring movable between a relaxed position and a tensioned position and guided in a receiving groove formed in the other edge of the supporting member.

When the arrangement is designed in accordance with the present invention, printed circuit boards, partitions or the like can be fixedly mounted in the housing in a very simple manner. First, a printed circuit board, a partition or the like is fixed on the one edge of the supporting member, whereafter the printed circuit board with the supporting member is inserted into a housing, and the spring is tensioned and increases its length so as to be clamped in two opposite lateral walls of the housing. In order to withdraw the printed circuit board, the partition or the like out of the housing, it suffices to relax and thereby to contract the spring, whereafter the supporting member together with the printed circuit board, partition and the like can be easily withdrawn from the housing.

In accordance with another feature of the present invention the holding means of the supporting member includes a receiving groove arranged in the one edge of the supporting member so as to receive the printed circuit board, partition and the like, and a clamping screw extending transverse to the groove and clamping the printed circuit board, partition and the like in the receiving groove.

In accordance with still another feature of the present invention, the spring has two end portions which are wider than the remainder portion of the spring and guided in the guiding groove of the supporting member.

In accordance with yet another feature of the present invention, the actuating means includes a slider which is movable in a second guiding groove and arranged to act upon the spring so as to tension and to relax the latter during the movement. The sliding member may have an actuating portion which is rounded and abuts against the spring so as to tension and to relax the latter.

A further feature of the present invention resides in that the spring has a central convex portion and two adjoining concave portions. The spring may further have two abutment portions which outwardly surround the adjoining portions and are strongly curved. The portions of the spring may be formed as arcuate turns.

In accordance with still a further feature of the present invention, the spring may have a curved central portion, and the actuating means may include a threaded member which extends through the central portion so as to act upon the latter and to tension or relax the spring. The threaded member may extend through a nut which is immovably mounted in a recess of the supporting member.

Yet a further feature of the present invention is that the actuating means may include a threaded member which abuts against the curved central portion of the spring so as to tension and relax the latter. The threaded member may extend through a threaded receiving part arranged in a receiving recess of the supporting member.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

FIG. 2 is a view showing a longitudinal section of the housing with the inventive arrangement and a printed circuit board mounted in the same;

FIG. 3 is a side view of the inventive arrangement for mounting a printed circuit board in the housing;

FIG. 4 is a view showing a section taken along the line IV—IV in FIG. 3;

FIG. 5 is a view showing a section corresponding to that of FIG. 4, but illustrating a spring member of the arrangement in its expanded position.

DESCRIPTION OF THE PREFERRED EMBODIMENTS

Figure 1:
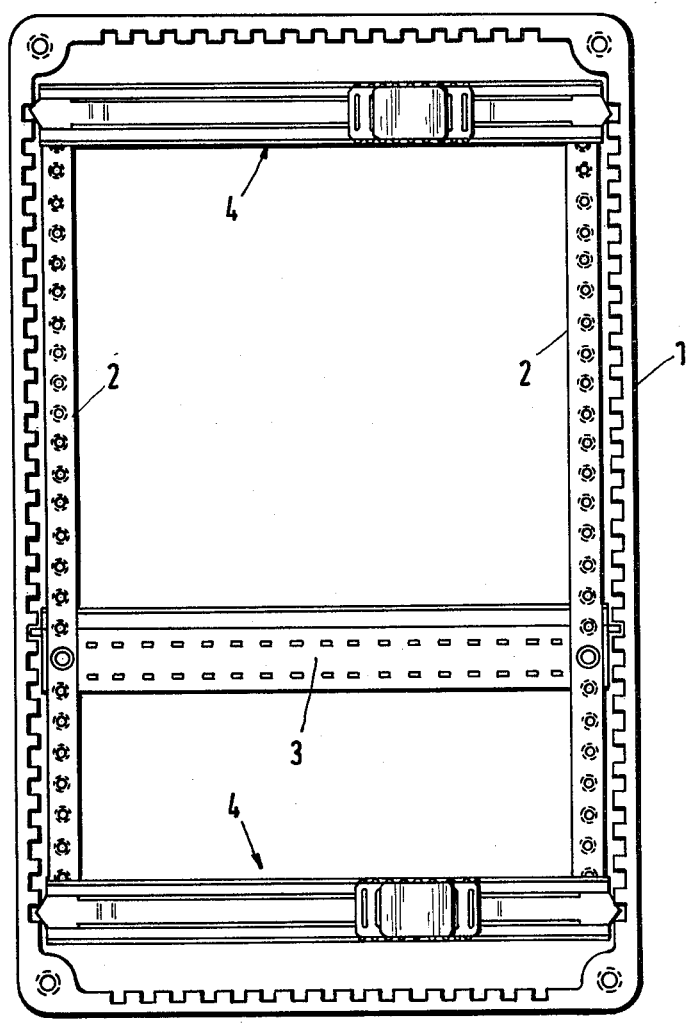
FIG. 1 is a plan view of a housing with a mounting arrangement in accordance with the present invention.

A housing in which a printed circuit board, partition and the like must be mounted, is identified by reference numeral 1. As can be seen from FIG. 1, a mounting frame including two longitudinal bars 2 and a transverse bar 3 is arranged in the housing 1. The mounting frame is mounted in the housing 1 with the aid of two arrangements 4 whose construction will be explained hereinbelow. FIG. 2 shows the housing in which a printed circuit board 5 is mounted with the aid of the arrangements 4.

As can be seen from FIGS. 3–5 each arrangement 4 for mounting the printed circuit boards 5, the mounting frames or other elements, includes a supporting member 6 with a shaped spring 7 which extends in the longitudinal direction of the supporting member. The spring 7 in its relaxed condition shown in FIG. 4 has a length which substantially corresponds to the length of the supporting member 6. On the other hand, the spring 6 in its tensioned condition shown in FIG. 5 is longer than the supporting member 6 and its end portions engage in grooves 8 of the housing 1.

The supporting member 6 in the region of its one elongated edge is provided with a receiving groove 9 in which the printed circuit board 5 or the like can be inserted. The printed circuit board 5 is clamped in the receiving groove 9 by several clamping screws 10.

There is no need to fix the lower end of the printed cicuit board 5 shown in FIG. 3, because the printed circuit board 5 is guided in the grooves of the housing 1 and the supporting member 6, in which the circuit board 5 is clamped, prevents an axial displacement.

The end portions of the spring 7 are somewhat wider than the central portion of the springs. The supporting member 6 is provided with a groove 11 which is arranged at the opposite edge relative to the groove 9. The wider end portions of the spring 7 are guided in the groove 11. The remainder portion of the spring 7 extends upwardly out of the groove 11.

A further guiding groove 12 is provided in the supporting member 6 above the groove 11. A slider 13 is guided in the guiding groove 12 and moves in the direction of elongation of the supporting member 6. The slider 13 has a rounded lower portion which faces toward the spring 7, as can be seen from FIGS. 4 and 5. The spring 7 can be tightened or relaxed during the movement of the slider 13 in the longitudinal direction of the supporting member 6.

In order to insert a printed circuit board 5 into the housing and arrest the same inside the housing, the printed circuit board 5 is first inserted into grooves 8 of the housing 1 and moved in the grooves so deep as necessary for mounting purposes. Now, the slider 13 is displaced and the spring 7 is tensioned so that the entire arrangement 4 together with the printed circuit board 5 is arrested in the housing 1.

It is also possible to provide the end portions of the spring 7 which extends laterally outwardly beyond the supporting member 6, with a tip. In such a construction, the arrangement 4 can be arrested in the housing 1 which has smooth lateral walls. The end portions of the spring 7 which are provided with the teeth are also advantageous even in the housings which have the grooves 8, as shown in the illustrated embodiment.

Figure 6:
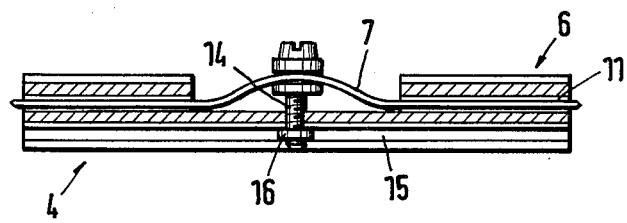
FIGS. 6 and 7 are views showing longitudinal sections of the arrangement in accordance with two further embodiments of the present invention.
Figure 7:
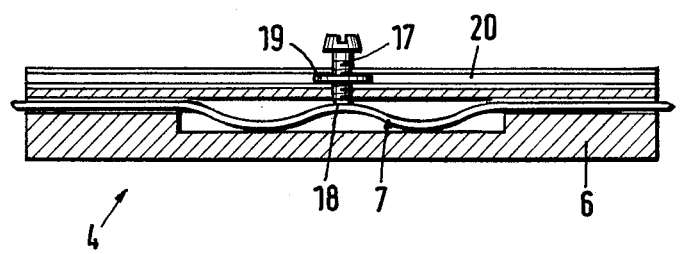

FIGS. 6 and 7 show the arrangement in accordance with further embodiments of the invention. The arrangements shown in FIGS. 6 and 7 have the same means for clamping the printed circuit boards and the like as the arrangement of FIGS. 3–5. For this reason, this means is not shown in FIGS. 6 and 7.

In the embodiment of FIG. 6, the spring 7 is again guided in the groove 11 of the supporting member 6. The spring 7 has a central region which is curved. A screw 14 extends through the central portion of the spring 7 and is screwed in a nut 16. The nut 16 is arranged in a groove 15 of the supporting member 6 so as not to rotate. When the screw 14 is screwed into the nut 16, the spring is tensioned and expands in the longitudinal direction so that the desired clamping effect against the lateral walls of the housing takes place.

The arrangement in accordance with the embodiment of FIG. 7 also has the spring 7 with a central curved portion or turn 18. A screw 17 is arranged so as to abut against the curved portion 18. The screw 17 extends through a threaded part 19 which is arranged in a longitudinal groove 20 of the supporting member 6 so as not to rotate. When the screw 17 is screwed into the threaded member 19 toward the curved portion 18 of the spring 7, the latter is tensioned.

The spring 7 of the arrangements shown in FIGS. 3–5 has three arcuate turns 21–23 in the central region. The middle turn 22 is convex whereas the outer turns 21 and 23 are concave. The concave turns 21 and 23 are surrounded from outside by strongly curved abutment turns 24 and 25.

When the spring 7 is so designed, the slider 23 in the respective end position is located inside one of the concave turns 21 or 23, and further displacement or unintentional loss of the slider from the tension position is prevented.

It will be understood that each of the elements described above, or two or more together, may also find a useful application in other types of constructions differing from the types described above.

While the invention has been illustrated and described as embodied in an arrangement for mounting printed circuit boards, mounting partitions and the like in a housing it is not intended to be limited to the details shown, since various modifications and structural changes may be may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this inventions.

What is claimed as new and desired to be protected by Letters Patent is set forth in the appended claims:

1. An arrangement for mounting objects, particularly printed circuits, mounting partitions, in a housing having walls provided with a plurality of guide grooves, the arrangement comprising an elongated supporting member arranged to be inserted into and withdrawn out of the housing and to extend transversely of the guide grooves between two opposite guide grooves of the housing, said supporting member having receiving means for releasably mounting an object, and a longitudinal groove extending in direction of elongation of said supporting member; a tensionable spring member having two end portions arranged in said longitudinal groove of said supporting member so that in relaxed condition said spring member has a length substantially corresponding to that of said supporting member and in tensioned condition said spring member projects with its end portions outwardly beyond said supporting member to engage in the opposite guide grooves of the housing; and actuating means arranged to displace in said supporting member transversely to the guide grooves and to thereby relax or tension said spring member.

2. An arrangement as defined in claim 1, wherein said supporting member has one and another edges, said receiving means being provided in said one edge, whereas said other edge of said supporting member has said longitudinal groove.

3. An arrangement as defined in claim 1, wherein said spring member has a central region and is provided in said central region which a central portion which is convex in the relaxed position of said spring member, said actuating means being arranged to act upon said convex portion of said spring member.

4. An arrangement as defined in claim 3, wherein said spring member has two portions adjoining said central portion, said adjoining portions being concave.

5. An arrangement as defined in claim 4, wherein said spring member has two abutment portions outwardly surrounding said adjoining portions and being strongly curved.

6. An arrangement as defined in claim 5, wherein said portions of said spring are formed as arcuate turns.

7. An arrangement as defined in claim 3, wherein said spring member is arranged so that only said end portions of said spring member are guided in said longitudinal groove of said supporting member.

8. An arrangement as defined in claim 7, wherein said end portions of said spring are wider than the remainder portion of the same.

9. An arrangement as defined in claim 3, wherein said supporting member has a further groove which is parallel to said longitudinal groove, said actuating means including a sliding member which is displaceable in said further groove so that depending upon its displacing position said sliding member depresses said convex portion of said spring member.

10. An arrangement as defined in claim 9, wherein said sliding member has an actuating portion which is rounded and arranged to abut against said spring during the movement of said sliding member.

11. An arrangement as defined in claim 3, wherein said actuating means includes a threaded member screwable into said supporting member transversely to said spring member so as to depress said convex portion of said spring member.

12. An arrangement as defined in claim 3, wherein said receiving means of said supporting member is formed as a receiving groove in which an edge of the object can be clamped.

* * * * *